United States Patent [19]

Ainsworth

[11] Patent Number: 5,245,630
[45] Date of Patent: Sep. 14, 1993

[54] EQUALIZED EYE PATTERN INSTRUMENT

[75] Inventor: Kenneth M. Ainsworth, Aloha, Oreg.

[73] Assignee: Tektronix, Inc., Wilsonville, Oreg.

[21] Appl. No.: 682,774

[22] Filed: Apr. 9, 1991

[51] Int. Cl.[5] .................. H03H 7/30; H04B 3/46; H04B 17/00

[52] U.S. Cl. .................. 375/10; 375/11; 324/616; 455/226.4

[58] Field of Search .............. 375/11, 10, 8; 333/18; 324/612, 616, 77 B, 617, 121 R; 340/658; 370/13, 17; 455/226.4; 371/20.4

[56] References Cited

U.S. PATENT DOCUMENTS

| | | | |
|---|---|---|---|
| 4,227,160 | 10/1980 | Tamori et al. | 333/18 |
| 4,449,223 | 5/1984 | Liskov et al. | 375/10 |
| 4,639,934 | 1/1987 | Zuranski et al. | 375/10 |
| 4,833,690 | 5/1989 | Zuranski et al. | 375/8 |

Primary Examiner—Curtis Kuntz
Assistant Examiner—Tesfaldet Bocure
Attorney, Agent, or Firm—Francis I. Gray

[57] ABSTRACT

An equalized eye pattern instrument inserts an equalizer between the input of the instrument and a display device for the instrument. The equalizer compensates for losses and other distortions in a transmission path so that a digital signal at the input of the instrument may be presented to the display device in a form suitable for eye pattern display. A switch may be used to bypass the equalizer when not needed so that the input digital signal may be directly displayed. Further the equalizer is preferably adaptive so that the input digital signal may be restored to its undistorted form from the source.

3 Claims, 3 Drawing Sheets

EQUALIZED EYE PATTERN INSTRUMENT

BACKGROUND OF THE INVENTION

The present invention relates to waveform display instruments, and more particularly to an equalized eye pattern instrument for extending the usefulness of eye pattern analysis to any point along a digital transmission path.

Although digital systems generally process data in parallel digital form, for transmission over long distances the parallel digital data often is transformed into serial digital data. At the receiving end of such a transmission path the serial digital data is transformed back to parallel digital form. The receiving end of a digital transmission path includes a receiver with an equalizer to return the received data to the form at the transmission end, i.e., the equalizer terminates the transmission path at the receiving end. A waveform display instrument that looks at the data at the receiving end after the equalizer may produce the well known eye pattern that is used to analyze error performance and to optimize the digital signal. However when there is an error along the transmission path that results in no signal at the receiver, it is desirable to be able to display an eye pattern for the signal at any point along the transmission path. For coaxial cable as a transmission medium with a 800 millivolt peak-to-peak input signal after approximately 100 meters it is not possible to obtain an eye pattern of the signal using a conventional waveform display instrument as the signal is attenuated such that it is lost in the noise.

What is desired is a waveform display instrument that may be used to display eye patterns for a digital signal at any point along the transmission path of the digital signal.

SUMMARY OF THE INVENTION

Accordingly the present invention provides an equalized eye pattern display instrument for displaying an eye pattern for a digital signal at any point along the transmission path of the digital signal. The digital input signal is input to the instrument and is selectably transmitted either directly to a voltage versus time device, such as a cathode ray tube (CRT), or to an adaptive or automatic equalizer. When the digital input signal is input to the equalizer, a reverse transform is performed to recover the digital signal as it appeared at the input to the transmission path. The equalized digital signal is then displayed on the display device as an eye pattern.

The objects, advantages and novel features of the present invention are apparent from the following detailed description when read in conjunction with the appended claims and attached drawing.

DESCRIPTION OF THE PREFERRED EMBODIMENT

Figure 1:
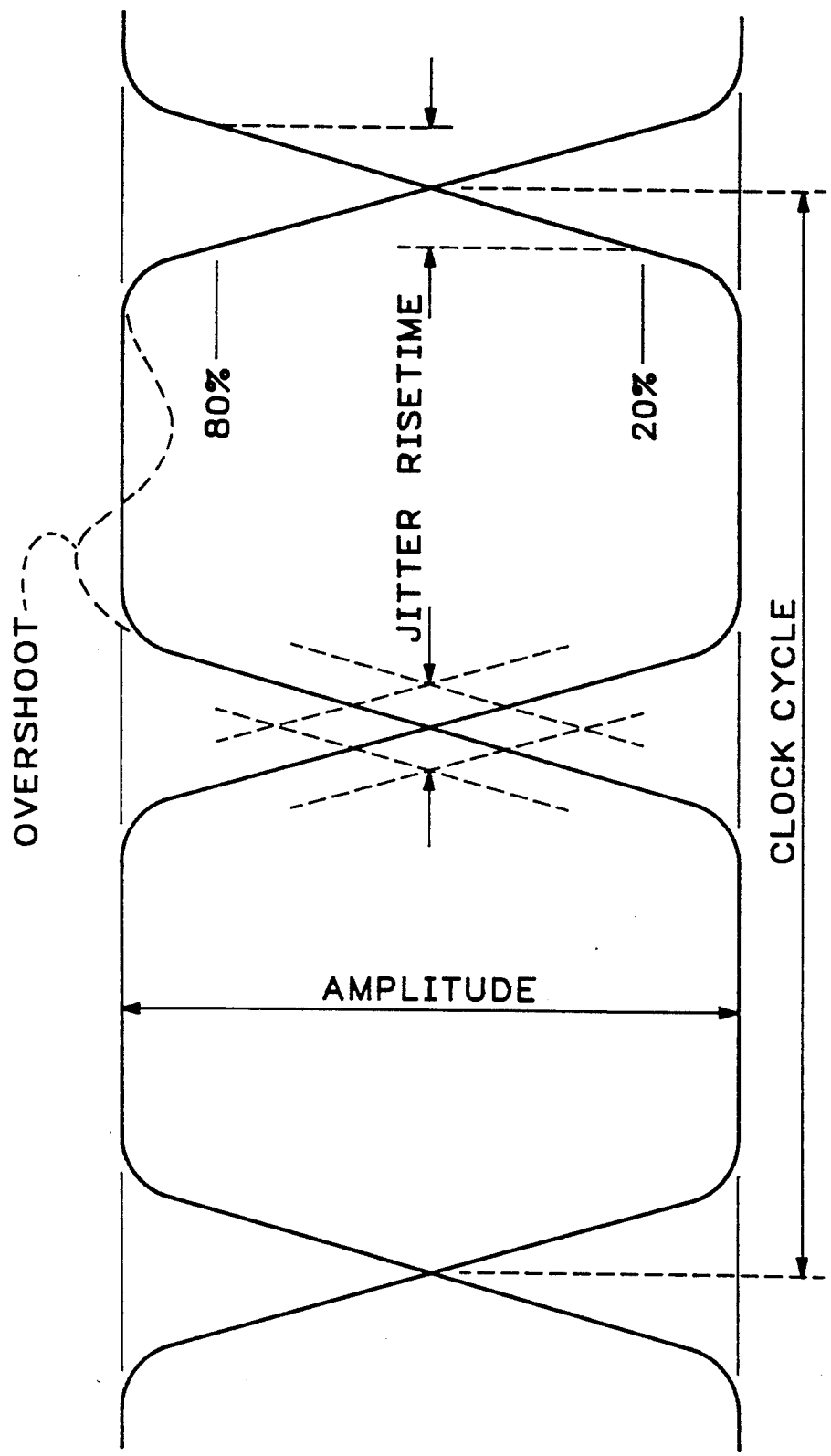
FIG. 1 is an illustration of an eye pattern display for digital data.

Referring now to FIG. 1 a typical eye pattern display for a digital signal is shown. From such a display various characteristics of the digital signal may be determined. These characteristics include amplitude between the two logic levels, the period of the clock for the digital signal, the amount of jitter for the digital signal, the risetime and falltime of the edges for the digital signal, and the amount of overshoot/undershoot for the digital signal.

Figure 2:
FIG. 2 is a simplified block diagram of a digital transmission system.

As shown in FIG. 2 a digital signal having a parallel n-bit configuration, such as 10-bit digitized video signals, is input to a serializer that converts the parallel data into a serial digital bit stream. The parallel digital words are input to the serializer at a specified clock rate and read out from the serializer at n times the clock rate. The resulting serial digital bit stream is then transferred along a transmission path to a receiver where it is deserialized, i.e., transformed back into parallel digital data. The receiver includes an equalizer to restore the characteristics of the serial digital bit stream as they were at the input to the transmission path.

Figure 4:
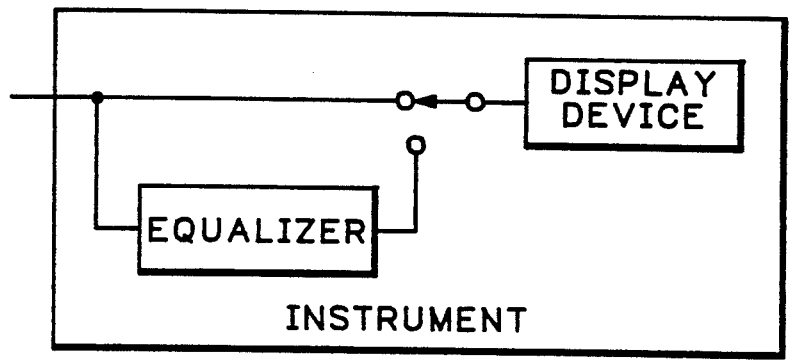
FIG. 4 is a simplified block diagram of an equalized eye pattern instrument according to the present invention.
Figure 5:
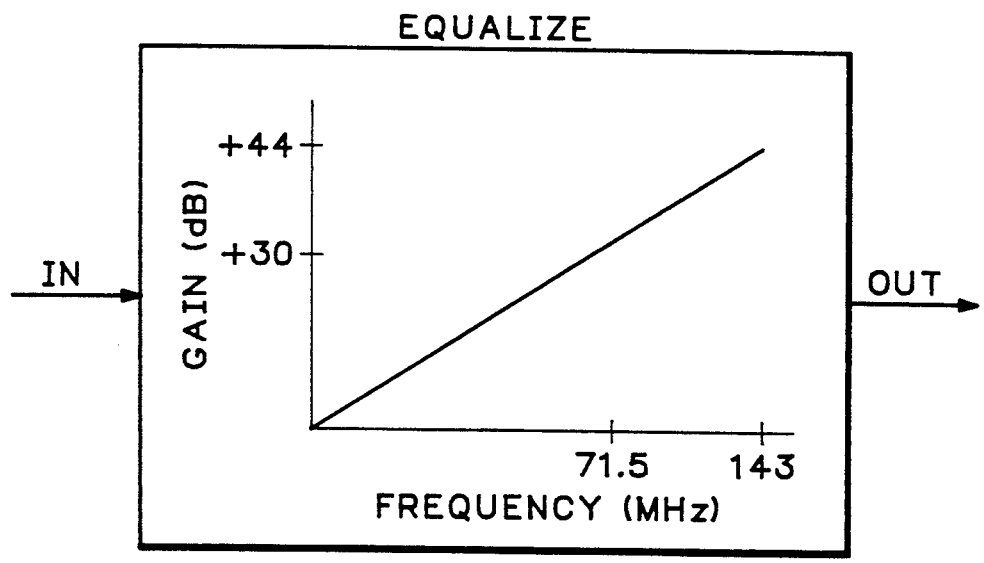
FIG. 5 is a representation of an equalizer for the equalized eye pattern instrument according to the present invention.
Figure 6:
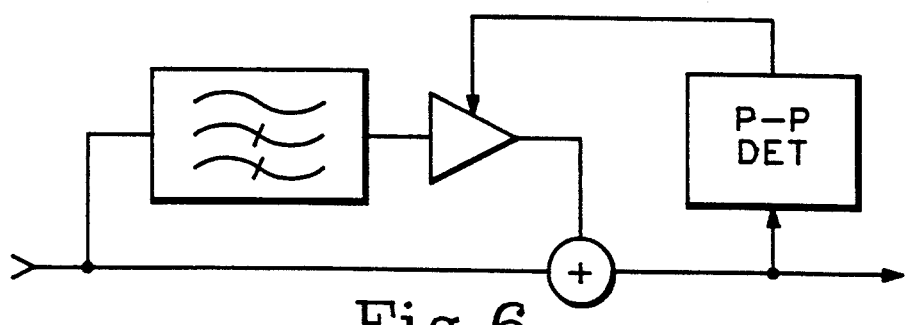
FIG. 6 is a simplified block diagram of one embodiment of an automatic equalizer for the equalized eye pattern instrument according to the present invention.
Figure 3:
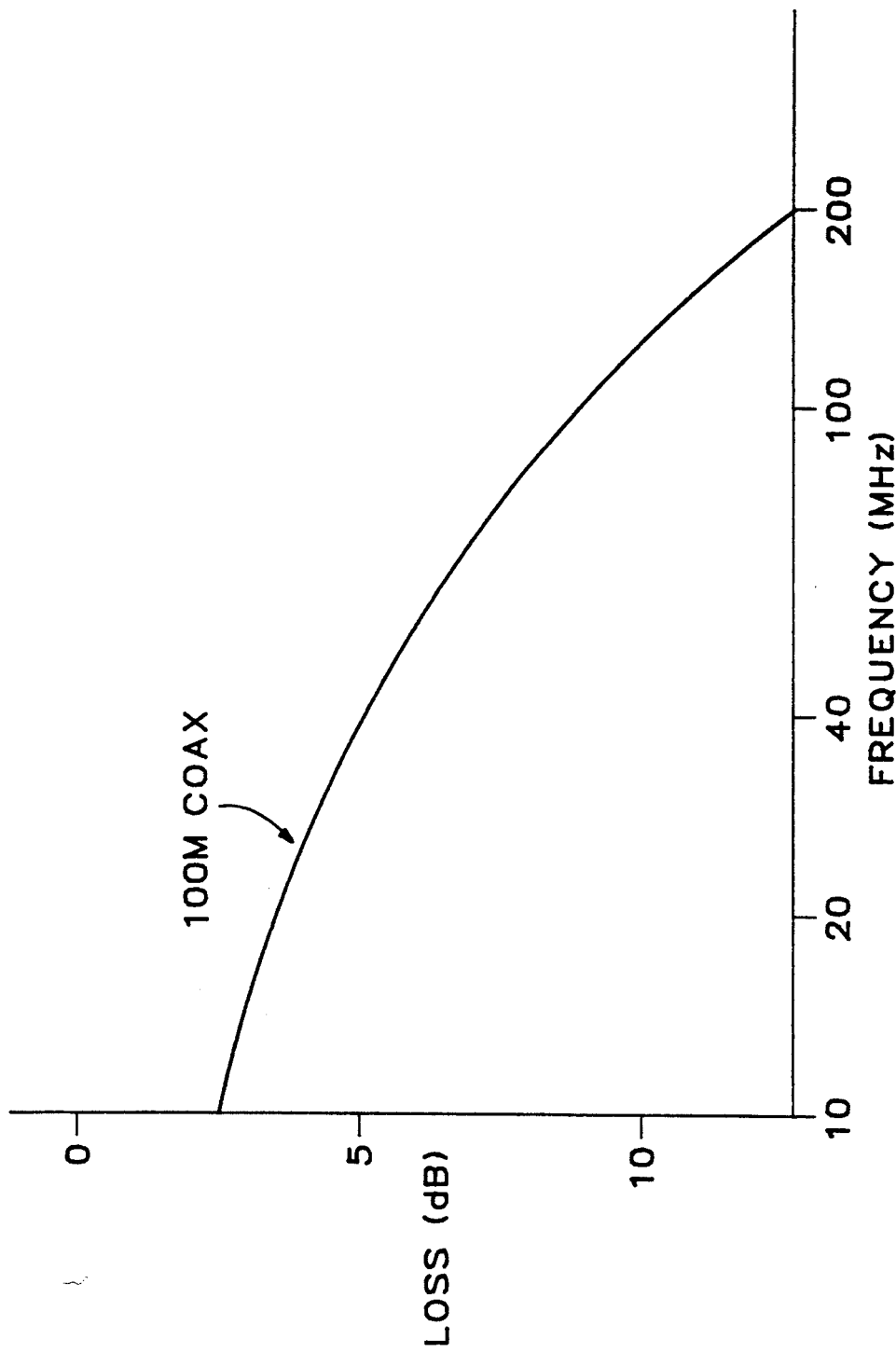
FIG. 3 is a graph of typical loss versus frequency for a coaxial cable portion of the digital transmission system of FIG. 1.

The transmission path typically is a coaxial cable, although any transmission path including fiber optic, microwave or the like may be used. For a one hundred meter long coaxial cable of a particular type, as shown in FIG. 3 there is a certain loss characteristic that is a function of length and frequency. The illustrated cable has approximately a 7.5 dB loss at 71.5 MHz, the frequency of interest for television applications. For a four hundred meter length of the same type of cable the total loss is approximately 30 dB. Thus for a 800 millivolt peak-to-peak signal input to the four hundred meter cable, at approximately 71.5 MHz the amplitude at the output is less than thirty millivolts. For such a cable the digital signal is essentially lost in the noise at the output without some sort of signal processing A typical instrument for measuring and displaying a received signal includes a display device for processing the received signal and displaying it as a waveform However such an instrument by itself does not have the ability to provide an eye pattern display for the received signal when the signal is attenuated to the point that it is lost in the noise. The present instrument as shown in FIG. 4 provides an equalizer to which the received signal is input, and a switch so that either the input or output of the equalizer may be input to the display device. The characteristic of the equalizer for a 400 meter cable is shown in FIG. 5 which shows that as the frequency increases so does the gain. An automatic equalizer is included as part of the 1602A deserializer integrated circuit manufactured by Sony Corporation of Tokyo, Japan. The architecture for the automatic equalizer portion of the deserializer is shown in FIG. 6. The received signal is input to a high pass filter that is approximately an inverse function of the cable loss characteristic, and to a summing node. The filtered signal is input to a variable gain amplifier, the output of which also is input to the summing node. The output from the summing node is input to a peak-to-peak detector that provides a variable gain control signal for the amplifier such that the output has the same peak-to-peak amplitude as the digital signal had at the input to the transmission path, i.e., for a 800 millivolt signal the amplifier gain is adjusted by the peak-to-peak detector until the output from the summing node also is a 800 millivolt signal.

In operation the present instrument may be used to measure the serial digital signal at any point along the transmission path to obtain eye pattern displays, not just at the receiver where the transmission path is terminated in an equalizer. The equalizer in the instrument adjusts the signal received at the input so that an eye pattern display may be achieved by the instrument.

Although a simple automatic equalizer is described and specified above, and a manually adjustable equalizer could be used, a more sophisticated equalizer may be used that uses a transversal or digital filter to match the signal to a predefined template, making the equalizer a truly adaptive equalizer to compensate for more than linear transmission path loss.

Thus the present invention provides an equalized eye pattern instrument for providing eye pattern displays at any point in a digital signal transmission path by inserting an automatic or adaptive equalizer at the front end of the instrument.

What is claimed is:

1. An equalized eye pattern instrument of the type having an input and means coupled to the input for displaying a digital signal applied to the input as a function of amplitude versus time further comprising an equalizer having an input coupled to the input of the instrument and having an output coupled to the displaying means so that the digital signal is compensated for distortions between the source of the digital signal and the instrument by the equalizer before input to the displaying means.

2. An instrument as recited in claim 1 further comprising means for switching the input to the displaying means between the input and output of the equalizer.

3. An instrument as recited in claim 1 wherein the equalizer comprises:
   means for varying the digital signal according to a control signal; and
   means for generating the control signal from the output of the varying means so that the output of the varying means matches a predetermined template.

* * * * *